(12) United States Patent
Blander et al.

(10) Patent No.: US 8,786,059 B2
(45) Date of Patent: Jul. 22, 2014

(54) PASSIVATION LAYER SURFACE TOPOGRAPHY MODIFICATIONS FOR IMPROVED INTEGRITY IN PACKAGED ASSEMBLIES

(75) Inventors: Alexandre Blander, Bromont (CA); Jon A Casey, Poughkeepsie, NY (US); Timothy H Daubenspeck, Colchester, VT (US); Ian D Melville, Highland, NY (US); Jennifer V Muncy, Ridgefield, CT (US); Marie-Claude Paquet, Bromont (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/468,223

(22) Filed: May 10, 2012

(65) Prior Publication Data

US 2012/0228748 A1    Sep. 13, 2012

Related U.S. Application Data

(62) Division of application No. 12/625,590, filed on Nov. 25, 2009, now Pat. No. 8,236,615.

(51) Int. Cl.
*H01L 23/58* (2006.01)
(52) U.S. Cl.
USPC ........... 257/632; 257/690; 257/701; 257/737; 257/787; 257/E23.01; 257/E23.116; 257/E21.503
(58) Field of Classification Search
USPC ......... 438/124–127, 958, 689, 690, 694, 800, 438/106–118; 257/684, 787–793, 701, 702, 257/687, E23.132, 690, 737, E23.01, 257/E23.116, E21.503
See application file for complete search history.

(56) References Cited

U.S. PATENT DOCUMENTS

| 5,151,304 A | 9/1992 | Lee |
| 5,618,636 A | 4/1997 | Watanabe et al. |
| 6,194,076 B1 | 2/2001 | Matienzo et al. |
| 6,284,329 B1 | 9/2001 | Matienzo et al. |
| 6,350,668 B1 | 2/2002 | Chakravorty |
| 6,492,599 B1 | 12/2002 | Sugihara |
| 6,518,665 B1 | 2/2003 | Westby et al. |
| 6,589,712 B1 | 7/2003 | Hsu |

(Continued)

FOREIGN PATENT DOCUMENTS

| JP | H60-214594 | * 10/1985 | ............... H05K 3/18 |
| JP | H01-104632 | *  4/1989 | ................. C08J 7/00 |

(Continued)

OTHER PUBLICATIONS

Machine translation of title, Nakamura H60-214594, Thomson Reuters 2013, all pages.*

(Continued)

*Primary Examiner* — Fernando L Toledo
*Assistant Examiner* — Victoria K Hall
(74) *Attorney, Agent, or Firm* — Catherine Ivers; Kevin Anderson

(57) ABSTRACT

A structure and method for producing the same is disclosed. The structure includes an organic passivation layer with solids suspended therein. Preferential etch to remove a portion of the organic material and expose portions of such solids creates enhanced surface roughness, which provides a significant advantage with respect to adhesion of that passivation layer to the packaging underfill material.

17 Claims, 3 Drawing Sheets

(56) References Cited

U.S. PATENT DOCUMENTS

| | | |
|---|---|---|
| 6,600,224 B1 | 7/2003 | Farquhar et al. |
| 6,602,803 B2 | 8/2003 | Yew et al. |
| 6,872,648 B2 * | 3/2005 | Friese et al. ........... 438/601 |
| 7,042,070 B2 | 5/2006 | Yew et al. |
| 7,736,730 B2 * | 6/2010 | Jung et al. ............. 428/323 |
| 7,790,828 B2 | 9/2010 | Wu et al. |
| 7,842,223 B2 | 11/2010 | Getty et al. |
| 8,298,659 B2 * | 10/2012 | Anderson ............... 428/334 |
| 2002/0084456 A1 | 7/2002 | Sugihara et al. |
| 2002/0130397 A1 | 9/2002 | Yew et al. |
| 2004/0004283 A1 | 1/2004 | Yew et al. |
| 2004/0009300 A1 * | 1/2004 | Shimakura et al. ..... 427/407.1 |
| 2004/0062873 A1 * | 4/2004 | Jung et al. ............. 427/407.1 |
| 2004/0115868 A1 * | 6/2004 | Ono ....................... 438/127 |
| 2007/0015872 A1 | 1/2007 | Arima et al. |
| 2008/0017981 A1 | 1/2008 | Yaniv |
| 2008/0193742 A1 | 8/2008 | Maeda et al. |
| 2009/0028497 A1 | 1/2009 | Kodama et al. |
| 2009/0288699 A1 * | 11/2009 | Auman et al. ........... 136/249 |
| 2009/0314526 A1 * | 12/2009 | Nagasawa et al. ....... 174/255 |
| 2011/0135847 A1 * | 6/2011 | Phillps et al. ........... 427/595 |

FOREIGN PATENT DOCUMENTS

| | | | | |
|---|---|---|---|---|
| JP | 5-166976 | | 7/1993 | |
| JP | 05-251511 | | 9/1993 | |
| JP | 2005-101269 | * | 4/2005 | ............ H05K 3/46 |
| JP | 2009-70865 | | 4/2009 | |
| WO | WO 2007/086568 | * | 8/2007 | ............ B32B 15/08 |

OTHER PUBLICATIONS

Machine translation, Yoshida JP 2005-101269 (translation date, Apr. 16, 2013), JPO and Japio, all pages.*

English abstract, Yamada H1-104632 (translation date, 1989), JPO and Japio, all pages.*

Translation, Yamada, JP H1-104632, FLS, Inc. (translated Apr. 2013), all pages.*

Translation, Nakamura, JP H60-214594, FLS, Inc. (translated Apr. 2013), all pages.*

Machine translation of title, Nakamura, H60-215794, Thomson Reuters 2013, all pages.*

Machine translation, Yoshida, JP 2005-101269 (translation date: Apr. 16, 2013), JPO and Japio, all pages.*

English abstract, Yamada, JP H1-104632 (translation date: 1989), JPO and Japio, all pages.*

English translation, Yamada, Japanese Pat. Pub. No. H1-104632 (translation date: Apr. 2013), FLS, Inc., all pages.*

English translation, Nakamura, Japanese Pat. Pub. No. H60-214594 (translation date: Apr. 2013), FLS, Inc., all pages.*

* cited by examiner

PASSIVATION LAYER SURFACE TOPOGRAPHY MODIFICATIONS FOR IMPROVED INTEGRITY IN PACKAGED ASSEMBLIES

CROSS REFERENCE TO RELATED APPLICATIONS

This application is a divisional of U.S. patent application Ser. No. 12/625,590, filed Nov. 25, 2009 now U.S. Pat. No. 8,236,615, the entire contents of which are incorporated herein by reference.

FIELD OF THE INVENTION

The present invention relates to packaging integrated circuit chips and more specifically to improved adhesion of a chip to a packaging assembly at the interface between the chip passivation layer and the packaging underfill or encapsulation material.

BACKGROUND OF THE INVENTION

The integrity of a Flip-Chip Package (FCPBGA) assembly depends directly on the adhesive quality of the interface formed between chip-level passivation polyimide coating and the underfill material that is used to fill interstitial gaps between solder bumps in the cavity between the packaging plastic laminate and the chip. The integrity of a wirebond assembly similarly depends on the adhesion between the passivation and encapsulant materials. Historically, chips having die sizes in excess of about 150 mm$^2$ experience sufficiently high chip edge coefficient of thermal expansion (CTE)forces during thermal cycling that this interface is prone to failure if it is not of adequate integrity. Failure initiates at high DNP (distance to neutral point) locations, such as a corner. Once the interface begins to come apart, this delamination can spread over large areas of the chip corner, and can even propagate as a crack down into the BEOL levels of the chip. Deep thermal cycle and accelerated temperature cycling stress testing of parts is used to force failure of any interface with substandard reliability, during the normal technology and product evaluation phase. Chip parts with die sizes approaching 20 mm per edge and above (400 mm$^2$+) are particularly sensitive to this failure mechanism and require very careful engineering of this critical interface for long-term survival of the part. One technique is to add adhesion-enhancing design features near the chip edge, but this may consume chip area that could be used for circuitry or pose constraints on die size. The integrity of underfill to passivation adhesion in the package is currently a critical problem in the industry. Needed are additional ways to improve the durability and integrity of the passivation to encapsulant bond.

SUMMARY OF THE INVENTION

According to one embodiment, the present invention is a structure that includes a base structure over which a passivation layer is formed. The passivation layer is composed primarily of an organic polymer material, which may be polyimide, in which is suspended silicon-containing particles. The particles can have an average diameter between about 0.01 and 0.3 microns, and can be formed of an aminosilane or other adhesion promoter compound. A roughened surface can be formed by removing a portion of the organic polymer to at least partially expose a portion of those particles. The height variation of the roughened surface can be in the range of about 0.01 micron to 1.0 micron. An encapsulation layer can bond to the roughened surface to form an improved interface. The base structure can be an integrated circuit assembly comprising a) a semiconductor substrate, b) one or more dielectric layers formed on said substrate, and c) at least one device and an interconnect structure formed within said one or more dielectric layers. Furthermore, the base structure can be one of a plurality of such structures formed on a semiconductor wafer.

According to one embodiment, the above structure may include a package assembly bonded to the encapsulation layer, where the at least one device of the integrated circuit assembly is in electrical contact with a portion of the package assembly.

In another aspect of the invention a method is disclosed. The method includes a step of providing a base structure on which a passivation layer has been formed, where the passivation layer is composed of 1) an organic polymer material which may be polyimide and 2) silicon-containing particles which may be formed of an aminosilane compound; and another step of applying an encapsulation material to bond with the passivation layer. The base structure can be an assembly comprising 1) a semiconductor substrate having one or more devices formed thereon, and 2) a metallization layer comprising an interconnect structure formed within one or more dielectric layers. The method may include, prior to the providing step, applying a formulation over the base structure to form the passivation layer. Such formulation may include an aminosilane-like compound and over about 2% moisture, or may be formed by combining a quantity of Si-containing particles to a polymeric passivation layer formulation, wherein the quantity constitutes between 1 to 7 volume percent or between 1 to 100 particles per cubic micron of said combination.

The method may include a step of forming a roughened surface on the passivation layer prior to applying the encapsulation material, where such forming is achieved by removing a portion of the organic polymer material to expose a portion of one or more of the particles. The removing process can operate to remove a portion of the organic polymer material, and can form a roughened surface with a height variation of between 0.01 to 1.0 micron. The removing step can be achieved by any etch process that is selective for organic materials including RIE exposure or O2 plasma ashing.

The base structure can be one of a plurality of such structures formed on a single wafer, in which case the method may include a step of dicing the wafer to form individual chips, either before or after the applying step.

BRIEF DESCRIPTION OF THE DRAWINGS

The present invention will be understood and appreciated more fully from the following detailed description of the invention, taken in conjunction with the accompanying drawings.

Figure 1:
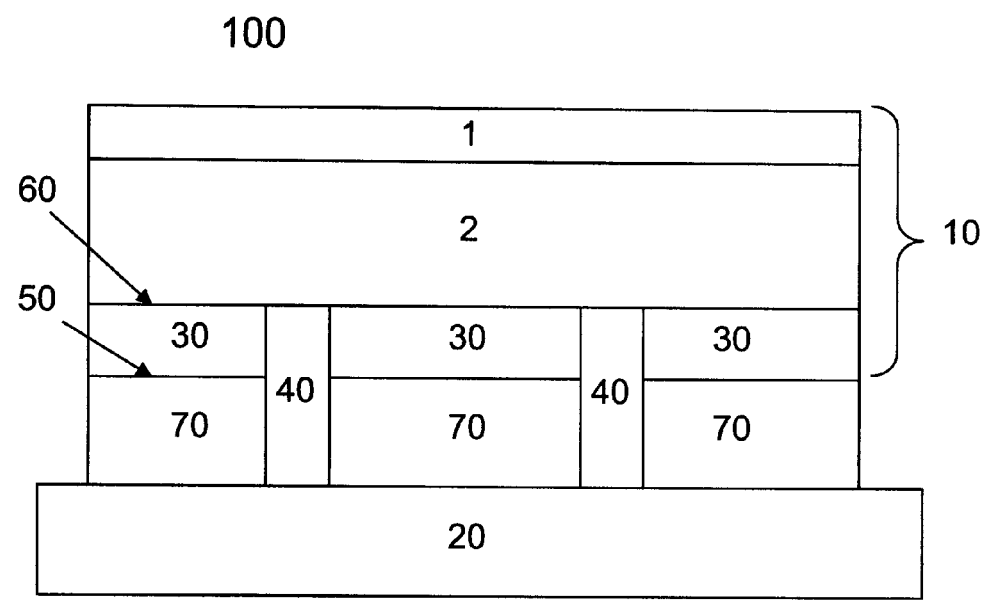
FIG. 1 is an elevation view of an integrated circuit assembly.

It will be appreciated that for simplicity and clarity of illustration, elements shown in the drawings have not necessarily been drawn to scale. For example, the dimensions of some of the elements may be exaggerated relative to other elements for clarity.

DETAILED DESCRIPTION OF THE INVENTION

FIG. 1 is a simplified elevation view of an integrated circuit structure 100 which includes an integrated circuit chip 10 attached to a packaging structure 20. The integrated circuit chip 10 has a device layer 1 which is the output of the "front end of the line" process (FEOL) and includes a semiconductor substrate on which have been formed microelectronic devices and dielectric layers (not shown). Integrated circuit chip 10 has a metallization layer 2 which serves to electrically connect the devices of layer 1 to each other or to an external circuit or both. The FEOL semiconductor substrate is typically a semiconductor wafer such as epitaxial silicon, and may optionally include one or more oxide layers such as in 'silicon on insulator' technology. Back end of the line (BEOL) processing creates metallization layer 2 which can include several insulator layers, each typically having a metal interconnect structure formed therein. To protect it from abrasion, contamination, and/or corrosion, the metallization layer is usually coated with a passivation layer 30. Common passivation materials include inorganic materials such as silicon dioxide or silicon nitride, and organic polymeric materials, for example, polyimide. Passivation layer 30 of the present invention is an organic polymer formulation. Typically in flip-chip technology, passivation layer 30 is a polyimide layer applied over a layer of hard dielectric (e.g. silicon nitride and/or oxide) (not shown in FIG. 1). Interface 60 is the bottom surface of passivation layer 30 and in contact with the hard dielectric layer if present, and surface 50 is the top of passivation layer 30.

Packaging structure 20 facilitates the connection of circuits on the IC chip 10 to external circuits through e.g., metal legs (not shown) that can be plugged into a circuit board. Contact structure 40 enables electrical connection between a contact such as a metal pad within the metallization layer 2 to a terminal embedded within packaging structure 20. Contact structure 40 can be a solder ball in the case of a flip-chip, and numerous other contact structures are known including gold wire. Encapsulant 70 fills the void space between contact structures 40. Materials identified as 'underfill', "molding compound", or "dam and fill" are all encapsulants which are formulated with a base resin, such as an epoxy or cyanate ester, a hardener which may be amine or anhydride based, and a catalyst, and may include other additives such as stress absorbers, fillers, coupling agents, and pigments.

Figure 2:
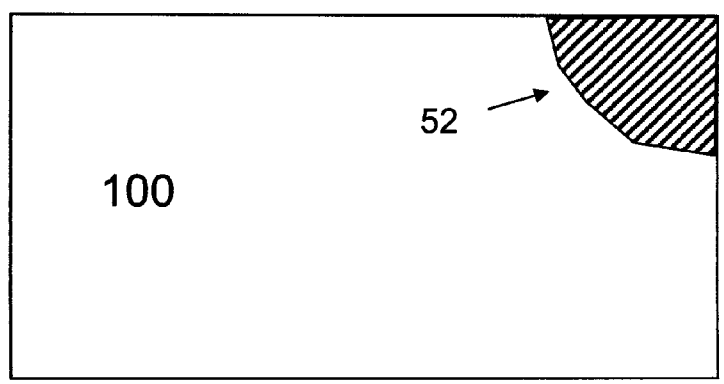
FIG. 2 illustrates chip delamination.

It may be appreciated that during fabrication and continuing through assembly and actual use, integrated circuit structure 100 can experience significant mechanical and thermal stresses. Such stress makes IC chips susceptible to delamination, particularly along the interface at surface 50 between passivation layer 30 and encapsulant 70. FIG. 2 illustrates a cross-section of integrated circuit structure 100, along surface 50. Delamination 52 tends to start at the corner of the structure within the chip/packaging interface and can propagate a crack into critical chip structures such as through a solder bump and even through BEOL metallization.

One example of a passivation material is HD4004 which is a photosensitive polyimide (PSPI) formulation available from HD Microsystems. Common polymeric passivation layer formulations such as HD4004 include a small concentration of a bulk film adhesion promoter. The adhesion promoter, also known as a bonding agent, can be part of the passivation material formulation or blended in separately prior to spin-application to the chip. A common adhesion promoter is gamma-aminopropyltriethoxysilane. The adhesion promoter is believed to promote adhesion between the polyimide and the chip by forming a transitional bond between the hard dielectric (SiOx, SiNx) on the chip side, and the polyimide itself, and therefore is generally an aminosilane-like molecule having a $SiO_2$-friendly (Silicon-containing) group on one end and a polyimide friendly ($NH_2$-containing group) on the other. The adhesion promoter is normally not distinguishable from the bulk polyimide film with cross-sectional scanning electron microscopy (SEM). That is, a typical cured layer of a polyimide formulation with bulk adhesion promoter appears to be a single-phase film.

Figure 3A:
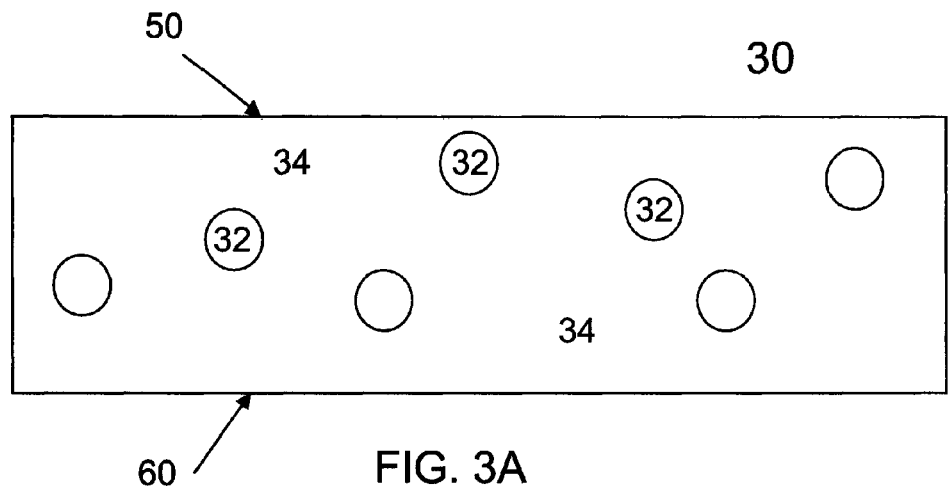
FIG. 3A illustrates a 2-phase passivation layer.

The present inventors have found that at least the Si-containing end of the adhesion promoter can form particles, that is, a second phase, when a polyimide formulation is produced in the presence of excess moisture. Specifically, a second phase particle can form if the formulation includes moisture in the range of between 1.5% and 5% or greater than about 2%, such as between 2% and 3%. Apparently, partial hydrolysis of the bulk adhesion promoter causes formation and precipitation in the bulk film of small particles of Si-containing material, these particles having an average diameter within the range of 0.01 micron to 0.3 micron, or between 0.05 micron and 0.2 micron, or about 0.1 micron. Solid particles could alternatively be added to a single phase passivation formulation to form a 2-phase passivation material at a density of about 5% or about 10 particles per cubic micron if the average particle diameter is about 0.1 micron. FIG. 3A depicts such a two phase passivation layer 30 comprising a first phase 34 with Si-containing particles 32 dispersed therein.

Preferential etching of the organic portion of the passivation layer tends to expose inorganic moieties. When the etch process is inherently selective for organic materials relative to inorganics, the presence of Si-containing particles near the exposed surface can create a roughened surface. This so-created "roughness" modification contributes significantly to the ability of this polyimide surface (on the package side) to form a strong adhesive bond with the underfill packaging material.

Any conventional etching process can be used, as long as it has a high removal rate for organic polymeric material and a very low or nonexistent rate for inorganic or SiOx-like materials. Oxygenated plasma ashing is known to have a high "selectivity" for removal of organic materials relative to inorganic materials (e.g., SiOx particles). Similarly, a fluorinated RIE process can preferentially or selectively remove the organic polymer. In the context of integrated circuit fabrication, such a selective etch can be applied during the wafer level process either after passivation layer cure or during (pre or post) the bumping operation, or it could also be done after the wafer is diced. For purposes of the present invention, it is preferred but not required that this etch roughening occur shortly before attaching the chip to the packaging structure. The etch depth can be several microns or more, but deep etching is not required to achieve the improved bond integrity of the present invention.

Figure 3B:
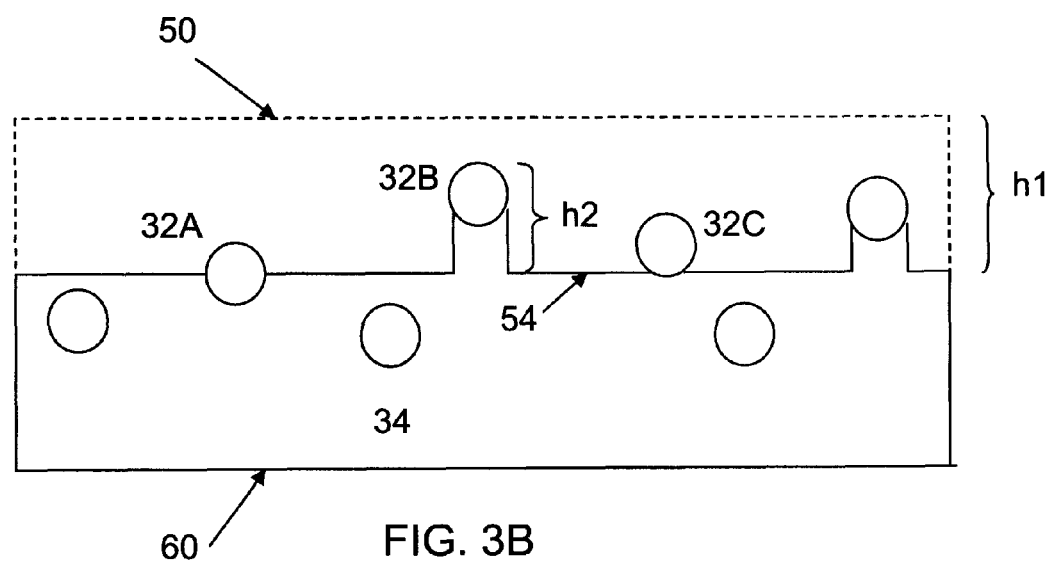
FIG. 3B illustrates the profile of a 2-phase passivation layer after exposure to etching.

FIG. 3B illustrates how the bulk presence of minute particles 32 can act as 'micromasks' whereby removal of a portion of material 34 to a nominal depth of h1 at least partially exposes a portion of such particles 32 to form bumps 32A or 32C, with a height up to that of a particle diameter, or even spikes of height h2 formed by a height of first phase material 34 and capped by a second phase particle 32B. The resulting roughened surface has a relatively smooth field 54, at depth h1 below the initial film surface. The height variation of the roughened surface for purposes herein means the average h2 height of the top of the exposed particles relative to the relatively smooth field 54.

Example 1

Large die-size test vehicle parts were formulated with hydrolyzed PSPI material according to one embodiment. The PSPI material was applied to wafers in the normal fashion. After standard curing, the wafers were exposed to an oxygen-plasma ash surface clean process. Some were subjected just to O2 plasma, whereas others were exposed to both RIE followed by O2 plasma processing. The PSPI layer can be removed to some degree by the RIE process, but typically the etch selectivity for this step is optimized for removing the inorganic hard dielectric relative to organics. However, the PSPI layer is strongly etched by the O2 plasma.

The O2 plasma ash selectively removed the polyimide locally around SiOx particles, lowering the PSPI average field height and exposing those SiOx particles near the surface, creating a localized surface "roughening" consisting of prominent SiOx spheres standing slightly above the surrounding polyimide. The presence of these exposed SiOx spheres significantly improved the durability of the polyimide/encapsulant interface. Improved adhesion was found with a gentle etch to a depth of only 0.1 micron, as well as at larger depths such as between 0.3-0.5 micron, or as much as 1.0 micron.

Figure 4B:
FIG. 4B is magnified view of the roughened surface of the 2-phase polyimide layer of FIG. 4A.
Figure 4A:
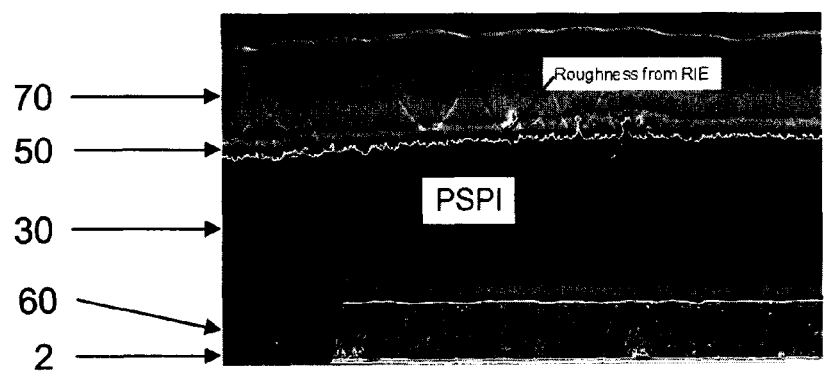
FIG. 4A is an SEM photograph showing the 2-phase polyimide layer according to an embodiment of the invention.

FIGS. 4A and 4B are SEM photographs of a cross section through a portion of an integrated circuit apparatus according to an embodiment of the invention. FIG. 4A shows a 2-phase PSPI layer corresponding to passivation layer 30 overlying metallization layer 2. As depicted, interface 60 is the bottom surface of passivation layer 30. The upper surface 50 was etched by RIE followed by O2 plasma ashing to form a roughened surface, shown in FIG. 4B. Particles 32 prevented the underlying polyimide from being etched resulting in the formation of bumps and spikes rising from the relatively smooth field 54.

After dicing, a significant sample of parts built into modules and tested per JEDEC-standard DTC stressing [−40 to 125 C, 2 cph], survived in excess of 1500 cycles without showing any sign of corner wear, film delamination or electrical failure. This is in contrast to a control population of standard polyimide modules which exhibited clear sign of corner film delamination at 1250 cycles and a high electrical fail rate at 1500 cycles. This stress involved a 26×21.5 mm chip in a 50 mm organic laminate package.

The foregoing description is intended to be illustrative and not limiting. While the invention has been described and demonstrated for flip-chip/solder bump packaging, those skilled in the art will appreciate that various changes can be made therein without departing form the spirit and scope of the invention. For example, the invention is equally applicable to wirebond packaging, for a standard assembly in which a mold compound forms the packaging interface with the chip-level polyimide.

What is claimed is:
1. A structure comprising:
a passivation layer over a base structure, said passivation layer comprising an organic polymer material and an adhesion promoter having a silicon-containing end; and
a plurality of particles in said passivation layer comprising moisture bonded to said silicon-containing end of said adhesion promoter, wherein at least some of said plurality of particles are on a surface of said passivation layer and separated by a gap not containing said organic polymer material so that said surface of said passivation layer is a roughened surface.
2. The structure according to claim 1, further comprising:
an encapsulation layer bonded to said roughened surface of said passivation layer.
3. The structure according to claim 1, wherein said organic polymer material is polyimide, and said adhesion promoter comprises an aminosilane-like compound.
4. The structure according to claim 2, further comprising:
a package assembly bonded to said encapsulation layer, and
wherein said base structure is an integrated circuit assembly comprising a device layer and a metallization layer, such that said device layer is in electrical contact with a portion of said package assembly.
5. The structure according to claim 1 wherein said particles have an average diameter between about 0.01 and 0.3 micron.
6. The structure according to claim 1 wherein a height variation of said roughened surface of said passivation layer is in the range of about 0.01 micron to 1.0 micron.
7. The structure according to claim 3 wherein said aminosilane-like compound is an aminosilane.
8. The structure according to claim 1, wherein the roughened surface of said passivation layer comprises a smooth field portion and a micromask area.
9. The structure according to claim 8, wherein the micromask area comprises a bump or a spike.
10. The structure according to claim 4 further comprising:
a contact structure to enable electrical connection of said metallization layer to said package assembly.
11. The structure according to claim 10 wherein said contact structure is adjacent to said encapsulation layer.
12. The structure according to claim 10 wherein said contact structure is a solder ball.
13. The structure of claim 1 further comprising a hard dielectric layer adjacent said passivation layer.
14. The structure of claim 1 further comprising a density of said particles in said passivation layer wherein said density is about 10 particles per micron cubed.
15. The structure of claim 1, wherein said particles comprise about 5 percent of said passivation layer.
16. The structure of claim 1, where said moisture bonded to said silicon-containing end of said adhesion promoter is a hydrolysis product.
17. The structure of claim 16, where said hydrolysis product is selected from the group consisting of H and OH.

* * * * *